United States Patent [19]

Bumen

[11] Patent Number: 5,237,278
[45] Date of Patent: Aug. 17, 1993

[54] IGNITION SIGNAL SAMPLING DEVICE FOR AN IGNITION SYSTEM, ESPECIALLY FOR AN INTERNAL COMBUSTION ENGINE

[75] Inventor: Werner Bumen, Kirchheim-Oetlingen, Fed. Rep. of Germany

[73] Assignee: Robert Bosch GmbH, Stuttgart, Fed. Rep. of Germany

[21] Appl. No.: 755,487

[22] Filed: Sep. 5, 1991

[30] Foreign Application Priority Data

Sep. 8, 1990 [DE] Fed. Rep. of Germany ....... 4028554

[51] Int. Cl.⁵ ............................................. F02P 17/00
[52] U.S. Cl. ..................................... 324/388; 324/402
[58] Field of Search .............. 324/388, 392, 402, 548, 324/72.5, 457; 73/116

[56] References Cited

U.S. PATENT DOCUMENTS

| | | | |
|---|---|---|---|
| 3,477,024 | 11/1969 | Pelta | 324/72.5 |
| 3,959,725 | 5/1976 | Capek | |
| 4,008,434 | 2/1976 | Schaefer | 324/402 |
| 4,490,799 | 12/1984 | Marino et al. | 324/388 |
| 4,742,306 | 5/1988 | Everett et al. | 324/388 |
| 4,758,791 | 7/1988 | Tedeschi et al. | 324/402 |
| 4,825,167 | 4/1989 | Bayba | 324/393 |

Primary Examiner—Kenneth A. Wieder
Assistant Examiner—Maura Regan
Attorney, Agent, or Firm—Michael J. Striker

[57] ABSTRACT

The ignition device of an internal combustion engine has at least one ignition coil in an ignition coil assembly and a secondary side device for ignition testing by detection of a secondary voltage signal from a secondary side from the ignition coils. The device for detecting the secondary voltage signals includes a standard measuring point device (13) at the outer periphery (P) of each ignition coil assembly, comprising advantageously a capacitive electrode, for capacitive read out of the secondary voltage signal from the secondary side of each of the ignition coils (1) in each of the ignition coil assemblies. A conductor (12) is connected electrically with the measuring point device (13) and capacitively to another conductor (8) connected to the secondary side of the ignition coil to transmit the secondary voltage signal from the secondary coil of each ignition coil (1) to the measuring point device (13). A capacitive signal receiver (14) is mounted on the outer periphery of the ignition coil assembly (11) in the vicinity of the measuring point device (13) of each of the ignition coil assemblies (11).

8 Claims, 2 Drawing Sheets

IGNITION SIGNAL SAMPLING DEVICE FOR AN IGNITION SYSTEM, ESPECIALLY FOR AN INTERNAL COMBUSTION ENGINE

BACKGROUND OF THE INVENTION

The present invention relates to an ignition device for a motor vehicle engine and, more particularly, to a ignition signal sampling device for detecting and observing the ignition spark voltage signals produced by the ignition system.

An ignition device for a motor vehicle engine is known having at least one ignition coil and a secondary side testing or signal sampling device for detecting the ignition voltage signals. An ignition device of this type has been described in U.S. Pat. No. 3,959,725 and German Published Patent Application 37 05 692.

The capacitive pick-up of the ignition voltage signals from the ignition coil in the ignition coil assembly is performed with the help of differently adapted sensor or adapter plates in the known devices for secondary side ignition signal sampling or signal detection. That means that the capacitive adjustment is made possible by special adjustment of sensor plates to the shape of the coil assembly. Similarly, an ignition coil signal sampling device described in German Published Patent Application 37 05 692 has a cable containing a conductor mounted on the outer surface of the housing of the ignition distributor with the ignition coil in it for read out of the ignition energy of the transmitted signal. This method and the other prior art methods however lead to difficulty, because the measured signal which they produce is influenced by events in the primary circuit of the ignition coil as well as the secondary coil voltage built up. Moreover, for each ignition spark event the transmitted signals must be such that equal-sized signals are produced for the same ignition voltage in the ideal ignition signal sampling device.

Similarly, the adjustment possible in rotating high voltage distributors at the spark cable is often not possible in the ignition system with stationary high voltage distribution and/or individual spark generation, since a direct access to the secondary side of the ignition coil is not possible, for example by a diode in the secondary circuit or a direct connection between the secondary coil and the spark plug without rebuilding or redesign of the unit.

SUMMARY OF THE INVENTION

These objects, and others which will be made more apparent hereinafter, are attained in an ignition device of an internal combustion engine with at least one ignition coil and ignition coil assembly and a secondary side device for ignition testing.

According to the invention, a standard measuring point device, advantageously a capacitive electrode, for read out of a secondary voltage signal from the secondary coil of each of the ignition coils is provided at the outer periphery of each of the ignition coil assemblies and a conductor is provided in each of the ignition coil assemblies, which is connected electrically capacitively to another conductor connected directly to a high voltage side of the secondary coil and also to the measuring point device at the outer periphery of each of the ignition coil assemblies.

This has the advantage that the secondary signal read out in the manner of the present invention is essentially not influenced by the primary circuit, so that a standard signal receiver can be used for different ignition devices, in which it transmits the same measured signal when the secondary voltage is the same.

The measured secondary voltage signal is read off the high voltage side of the secondary coil and/or the ignition coil and is transmitted to the measuring point device by a conductor. The measuring point device can be accessible from the exterior of the ignition coil assembly.

Advantageously, a signal receiver is provided on the exterior of the ignition coil assembly in the vicinity of the measuring point device. Advantageously a holding means or holder is provided for the signal receiver on the outside of the ignition coil assembly in the vicinity of the measuring point device.

The measuring point device can be formed as a capacitive electrode for a capacitive signal receiver.

It is particularly advantageous that a standard measuring point device is built into the ignition coil assembly during manufacture and that the signal receiver for the sampling of secondary voltage signals only need be mounted in the holder already provided on the ignition coil assembly at its outer periphery.

BRIEF DESCRIPTION OF THE DRAWING

The objects, features and advantages of the present invention will now be illustrated in more detail by the following detailed description, reference being made to the accompanying drawing in which.

DETAILED DESCRIPTION OF THE INVENTION

Figure 1:
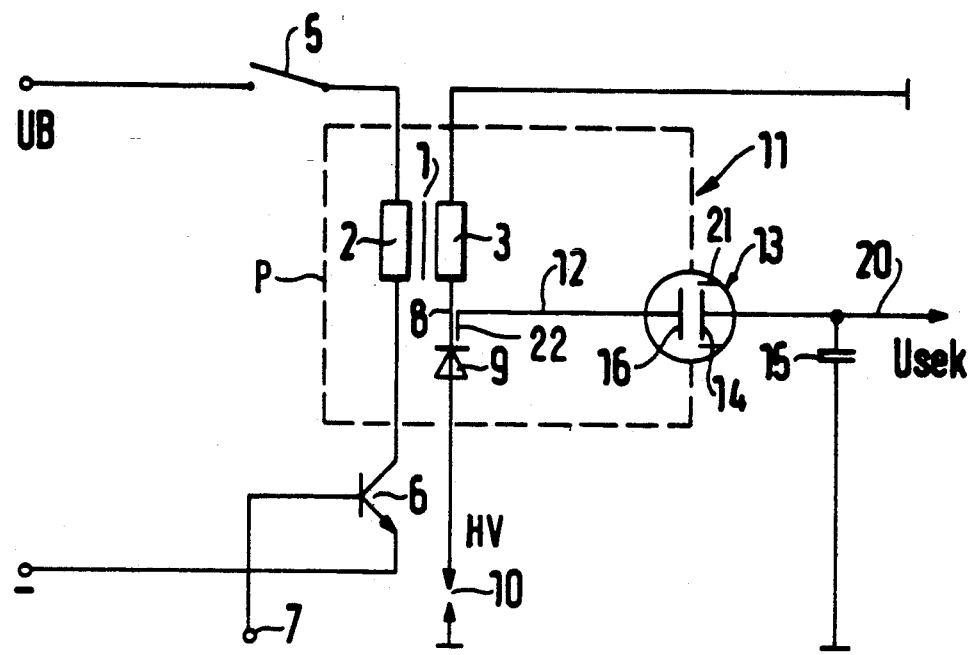
FIG. 1 is a circuit diagram of a part of an ignition system and an ignition signal sampling device showing an ignition coil assembly for a spark plug having a standard measuring point device according to one embodiment of the invention.

FIG. 1 shows an ignition coil 1, comprising a primary coil 2 and a secondary coil 3. On the primary side the primary coil 2 of the ignition coil 1 is connected by a switch 5 to a battery voltage UB at one end and, at the other end, by a transistor 6, which is controlled through a controlling terminal 7 connected to its base, to ground. The secondary coil 3 is connected at one end with ground potential and, at the other end, HV, with a spark plug 10 by a conductor 8 and a diode 9. In FIG. 1 the outer surface of the ignition coil assembly 11 is shown with dashed lines, which contains the ignition coil 1, the conductor 8 and the diode 9. The secondary voltage signal is sampled by a capacitive coupling of a coupling capacitor conductor 12 shown with dashed lines from the conductor 8. The coupling capacitor conductor 12 is connected to the standard measuring point device 1 of the ignition coil assembly 11. The standard measuring point device 1 is formed in the interior of the ignition coil assembly 11 by a capacitive electrode 16 which is embedded at the outer periphery (P) of the ignition coil assembly. A signal receiver 14 is mounted on the outside or outer periphery of the ignition coil assembly 11 at the measuring point device 13. This signal receiver 14 receives the secondary voltage signal, Usek, and transmits it over the measuring line 20 for further analysis and evaluation. A condenser 15 is connected in parallel to output terminal portion of the measuring line 20 over which Usek travels to ground.

The circuit described in FIG. 1 operates as follows: By switching off the current flowing through the primary coil 2 of the ignition coil 1 by the control transistor 6 a high voltage signal is induced in the secondary winding 3, which is transmitted at a negative potential through the diode 9 to the spark plug 10 and causes a spark. The secondary side observation of the growth of the potential is performed as follows: An end portion of the capacitive coupling conductor 12 (shown with dashed line) is arranged parallel to the conductor 8 at the output end of the secondary coil, so that it is capacitively coupled to this conductor 8. The coupling location is so selected that the primary signal has not the slightest influence on the sampled signal from the secondary side. According to the voltage built up in the secondary coil, the capacitive coupling conductor 12 is charged and similar events occur at the standard measuring point device 13 of the ignition coil assembly 11, because of its connection to the conductor 12. In installing and dimensioning the measuring int, device 13 the size and the spacing of the capacitive electrodes 14 and 16 are chosen, so that equal voltages produce equal signals. The electrode spacing is fixed by the spacing of the capacitive electrode 16 from the outer surface of the ignition coil assembly 11. Then the secondary signal is transmitted to the signal receiver 14 by a capacitive coupling and from there conducted to the output Usek.

The ignition coil assembly for the ignition coil can be so designed that the capacitive sampling of the secondary coil signals can occur without the capacitive coupling conductor 12 in such a way that the signal can be directly read off the secondary coil at the standard measuring point device. To do that, the ignition coil 1 must be already formed with secondary coil 2 and the ignition coil assembly 11 must be formed so that a capacitive read off of the high voltage coil can occur directly at the measuring point device of the ignition coil assembly to the signal receiver 14.

Figure 2:
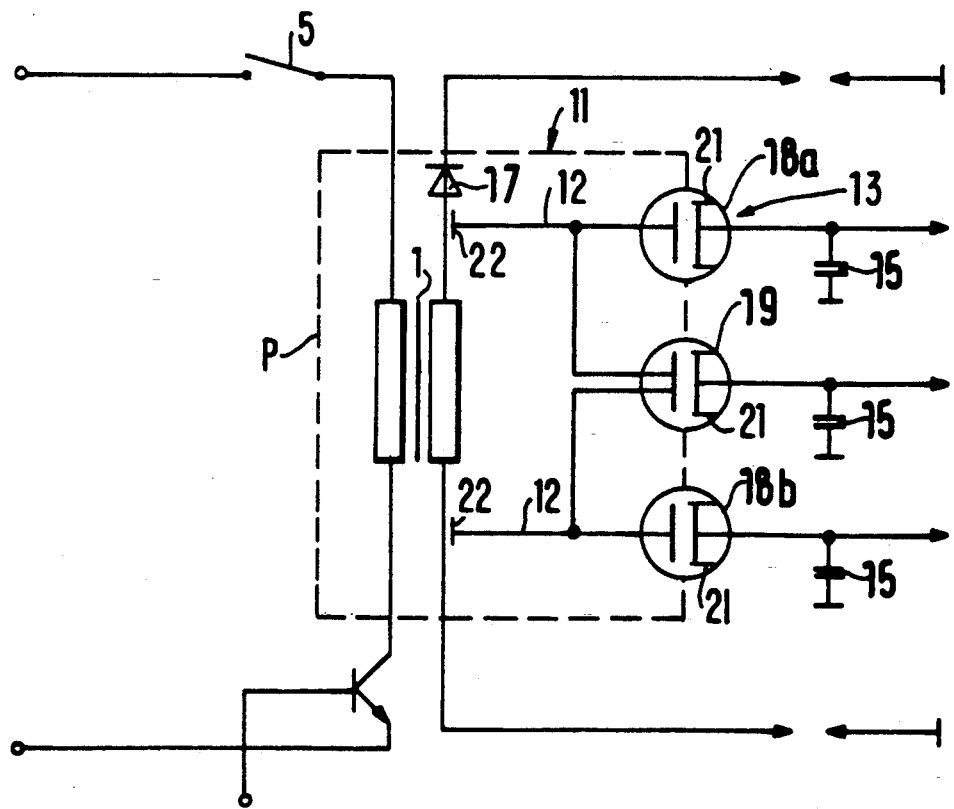
FIG. 2 is a circuit diagram of a part of an ignition system and an ignition signal sampling device showing an ignition coil assembly for a twin-sparking action with a standard measuring point device according to another embodiment of the invention.

FIG. 2 shows an ignition coil assembly with a double sparking ignition coil, which means each end of the ignition coil is connected to a spark plug. Between one end of the ignition coil and the connected spark plug a diode 17 is connected, so that, according to the polarity of the high voltage at one spark plug, a primary spark is produced, while at the other spark plug a supporting spark is produced, or the reverse.

The spark signal can be read off the secondary coil in the double sparking ignition coil by a capacitive sampling. Thus it is possible to detect and read out the signals of the primary spark (compression stroke) and the supporting spark (exhaust stroke) individually at the two measuring point devices 18a and 18b respectively or as a sum at the measuring point device 19.

To guarantee that the signal receiver 14 connected after assembly of the ignition coil assembly 11 to the ignition coil assembly 11 is attached exactly to the measuring point device 13, a holder 21 or an attachment hole is provided on or in the outer wall of the ignition coil assembly 11.

Figure 3:
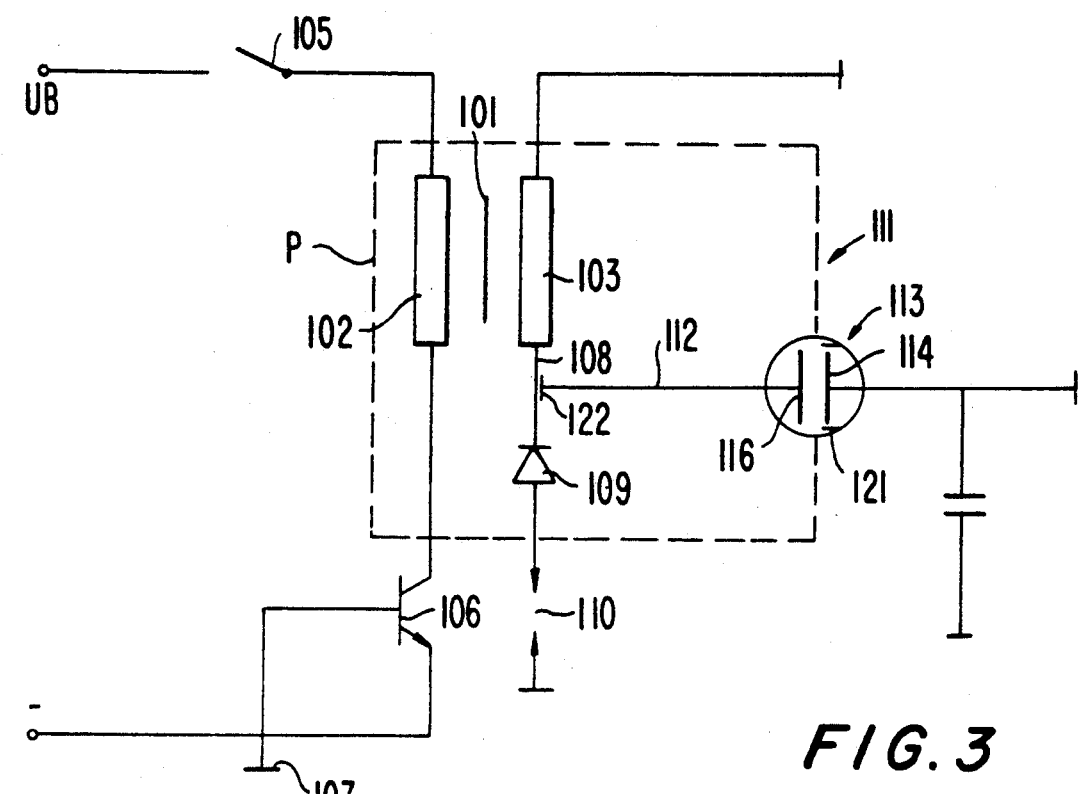
FIG. 3 is a circuit diagram of a part of an ignition system and an ignition signal sampling device showing two ignition coil assemblies and ignition coils and having standard measuring point devices according to an additional embodiment of the invention.
Figure 3:
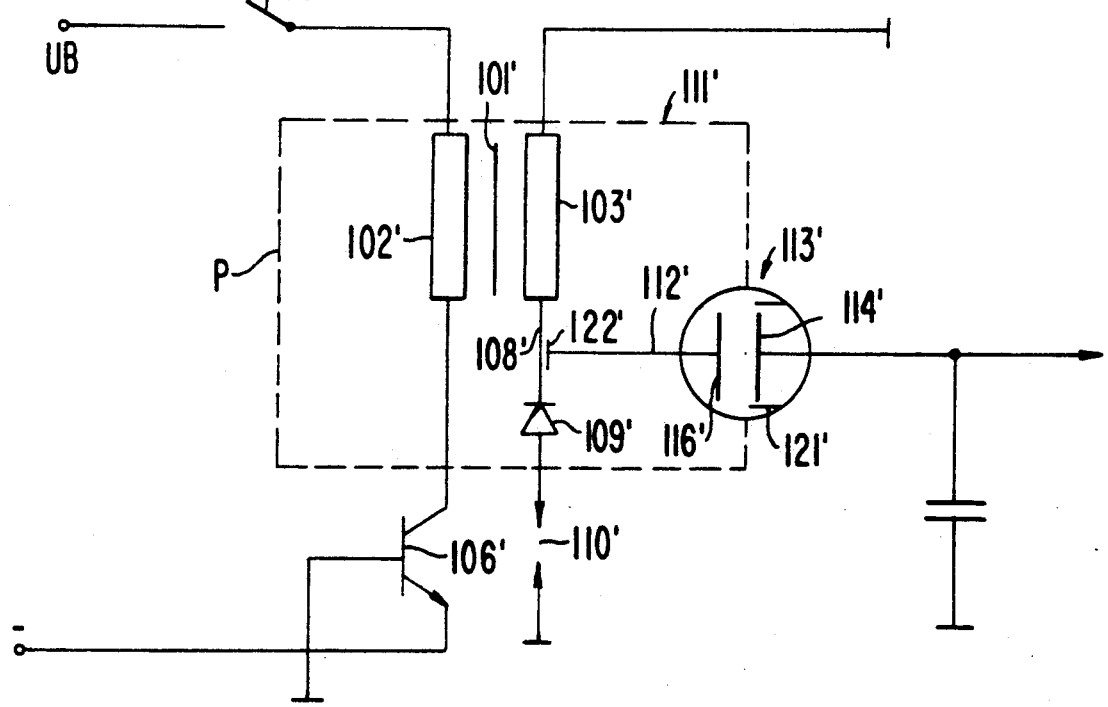

FIG. 3 shows another embodiment of the invention including two ignition coil assemblies 111,111' and two ignition coils 101,101'. This embodiment is similar to the embodiment of FIG. 1. It includes two ignition coil assemblies 111,111' including a primary coil 102,102' connected with transistors 106,106' and a secondary coil 103,103' connected with diodes 109,109'. Each of the secondary coils 103,103' is connected with a secondary side conductor 108,108'. A measuring point device 113,113' is connected electrically via a conductor 112,112' to the secondary side conductor 108,108'. The connection of the conductor 112,112' to the conductor 108,108' is capacitive as described for the embodiment above and is made by positioning a portion 122,122' of the conductor 112,112' spaced from and close to the conductor 108,108'. Use of the conductor 112,112' allows one to avoid inductive pick up of stray signals from the primary coil 102,102'. A signal receiver 114,114' is held in a holder 121,121' on the outer periphery of the ignition coil assemblies 101,101'. The measuring point device 113,113' and the signal receiver 114,114' can be either a capacitive device, such as a capacitive electrode, or a magnetic device.

While the invention has been illustrated and described as embodied in an ignition signal sampling device for an ignition system, especially for an internal combustion engine, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

I claim:

1. In an ignition device of an internal combustion engine having an ignition coil including a primary coil and a secondary coil, an ignition coil assembly having an outer periphery and a secondary side device for ignition testing, the improvement comprising a standard measuring point device (13) for capacitive read out of a secondary voltage signal from the secondary coil of said ignition coil (1) provides at the outer periphery (P) of said ignition coil assembly (11) and a conductor (12) in the ignition coil assembly (11), said conductor (12) being connected electrically to the measuring point device (13) at the outer periphery (P) of said ignition coil assembly (11) and having an end portion (22) oriented parallel to and spaced from another conductor (8) so as to be connected electrically capacitively to said other conductor (8), said other conductor (8) also being connected directly electrically to a high voltage side (HV) of the secondary coil so that a signal sampled from the secondary coil is not substantially effected by electrical interference from the primary coil.

2. The improvement as defined in claim 1, wherein the measuring point device (13) comprises a capacitive electrode in the ignition coil assembly.

3. In an ignition device of an internal combustion engine having an ignition coil including a primary coil and a secondary coil, an ignition coil assembly having an outer periphery and a secondary side device for ignition testing, the improvement comprising a standard measuring point device (13) for capacitive readout of a secondary voltage signal from the secondary coil of said ignition coil (1) provided at the outer periphery (P) of said ignition coil assembly (11) and a conductor (12) in the ignition coil assembly (11), said conductor (12) being connected electrically to the measuring point device (13) at the outer periphery (P) of said ignition coil assembly (11) and having an end portion (22) oriented parallel to and spaced from another conductor (8) so as to be connected electrically capacitively to said other conductor (8), said other conductor (8) also being connected directly electrically to a high voltage side (HV) of the secondary coil; and a signal receiver (14) mounted on the outer periphery (P) of the ignition coil assembly (11) in the vicinity of the measuring point device (13).

4. The improvement as defined in claim 3, further comprising a holder (21) for the signal receiver (14) located on the outer periphery (P) of the ignition coil assembly (11) in the vicinity of the measuring point device (13).

5. The improvement as defined in claim 3, wherein said measuring point device (13) comprises a capacitive electrode in the ignition coil assembly and said signal receiver (14) comprises another capacitive electrode.

6. In an ignition device of an internal combustion engine having at least one ignition coil assembly, each of said ignition coil assemblies including an ignition coil having a primary coil and a secondary coil and a secondary side device for ignition testing, the improvement comprising a standard measuring point device (113,113') for read out of a secondary voltage signal from the secondary coil (103,103') of each of said ignition coils (101,101'), said measuring point device being provided at the outer periphery (P) of each of said ignition coil assemblies (111,111'); and a conductor (112,112'), each of said conductors (112,112') being connected electrically to the measuring point device (113,113') at the outer periphery of each of the ignition coil assemblies (111,111') and connected electrically capacitively to another conductor (108,108') in each of the ignition coil assemblies (111,111'), said other conductor (108,108') being connected directly to a high voltage side (HV) of the secondary coil (103,103').

7. The improvement as defined in claim 6, wherein each of the measuring point devices (113) comprises a capacitive readout device.

8. The improvement as defined in claim 6, wherein each of the measuring point devices (113) comprises a magnetic readout device.

* * * * *